United States Patent [19]

Ono et al.

[11] 4,060,827
[45] Nov. 29, 1977

[54] SEMICONDUCTOR DEVICE AND A METHOD OF MAKING THE SAME

[75] Inventors: Minoru Ono, Kodaira; Toshimitu Momoi, Tokyo, both of Japan

[73] Assignee: Hitachi, Ltd., Japan

[21] Appl. No.: 607,697

[22] Filed: Aug. 25, 1975

Related U.S. Application Data

[63] Continuation of Ser. No. 219,470, Jan. 30, 1972, abandoned, which is a continuation of Ser. No. 701,988, Jan. 31, 1968, abandoned.

[30] Foreign Application Priority Data

Feb. 3, 1967 Japan ............................ 42-6608
Feb. 3, 1967 Japan ............................ 42-6609

[51] Int. Cl.² ............... H01L 29/78; H01L 27/02; H01L 29/34

[52] U.S. Cl. ............................ 357/54; 357/23; 357/41; 357/52

[58] Field of Search ............ 357/23, 52, 54, 41

[56] References Cited

U.S. PATENT DOCUMENTS

| 3,455,020 | 7/1969 | Dawson | 357/54 |
| 3,497,407 | 2/1970 | Esch et al. | 357/54 |
| 3,523,038 | 8/1970 | Sanders | 357/54 |
| 3,597,667 | 8/1971 | Horn | 357/54 |

Primary Examiner—Edward J. Wojciechowicz
Attorney, Agent, or Firm—Craig & Antonelli

[57] ABSTRACT

A transistor wherein a termination of a PN junction is covered with a silicon oxide film and all the exposed surfaces of said film are covered with a silicon nitride film.

4 Claims, 12 Drawing Figures

SEMICONDUCTOR DEVICE AND A METHOD OF MAKING THE SAME

This is a Continuation of application Ser. No. 219,470 filed Jan. 30, 1972, now abandoned, which, in turn, is a Continuation of application Ser. No. 701,988 filed Jan. 31, 1968, also abandoned.

BACKGROUND OF THE INVENTION

1. Field of the Invention

This invention relates to an improvement of a semiconductor device comprising double or multiple layers of passivation films and more particularly to a technique of passivating a semiconductor device with silicon compounds.

2. Description of the Prior Art

Generally, in a unit circuit element like a transistor, a diode, a semiconductor resistor, a capacitor, etc. or in a so-called integrated semiconductor device like an integrated circuit device composed by assembling many such circuit elements as described above, interconnecting the same and providing outgoing lead terminals thereto, the surfaces thereof and the parts which particularly affect the characteristics thereof, e.g., the PN junction parts, the part nearby which becomes a space charge layer, the region operating due to the diffusion of minority carriers, etc. are covered with a passivation film like a $SiO_2$ film because the characteristics of said elements or devices are worsened by the influence of external moisture, conducting materials, ionic materials or the like.

For a passivation film to be formed directly on a semiconductor surface, $SiO_2$ has been mainly used, but recently nitrides like $Si_3N_4$ are developed as a substitute for $SiO_2$. Generally, in $SiO_2$, the surface part of a Si substrate under the film has somewhat a tendency to turn to N conductivity type and said tendency is greater in $Si_3N_4$. According to the experiment of the present inventors, the increment of the surface electron density in the former is $3 \times 10^{11}$ electrons/cm$^2$, whereas in the latter case, the increment is $3 \times 10^{12}$ electrons/cm$^2$ and the ratio is 1 : 10. Accordingly, a method wherein $Si_3N_4$ is formed directly on a semiconductor surface is not always preferable. Further, though said $SiO_2$ is suitable for forming the film directly on a semiconductor surface on account of the small surface electron density, it has the disadvantage that the variation of the characteristics is frequently caused because metallic ion, for example, sodium ion can easily move in the $SiO_2$ film. Said defect is caused by the following mechanism. When ionic materials like Na+ enter $SiO_2$, the materials move in $SiO_2$ at a relatively low temperature (e.g. above 100° C.) and the movement thereof is remarkably forced by the application of an electric field. Thus, the characteristics are changed during the maintenance operation at a high temperature. Therefore, it is necessary to prevent the entrance of harmful ions like Na+ as much as possible in forming said $SiO_2$ passivation film. On the other hand, though the direct formation of a $Si_3N_4$ film on a Si substrate surface has the disadvantage described hereinabove, $Si_3N_4$ has the advantage that the movement of ionic materials like Na+ inside $Si_3N_4$ is quite small.

Another semiconductor device comprising double layers of passivation films consisting of a silicon oxide film and a silicon nitride film has been proposed. In such a semiconductor device, however, if a hole is provided in the double film consisting of a silicon oxide film and a silicon nitride film when fabricating a semiconductor device, excessive etching or side etching of the lower layer, where the etching speed is faster, i.e., the silicon oxide film, presents due to a difference in etching rate between the two, and thereby the fabrication of the device becomes very difficult.

SUMMARY OF THE INVENTION

An object of this invention is to provide a novel stabilized semiconductor device covered with silicon compound films.

Another object of this invention is to provide a simple and useful method of making said semiconductor device.

A further object of this invention is to provide a method of preventing the undesired influence caused by said side etching and thereby forming multiple layers of passivation films comprising a silicon oxide film and a silicon nitride film on a semiconductor surface.

A yet further object of the invention is to provide a semiconductor device having excellent characteristics whose variation is small, wherein a $SiO_2$ layer whose tendency to become N type being small is used as a first passivation layer for the semiconductor, a $Si_3N_4$ layer in which the tendency of ion movement being small is formed thereupon as a second passivation layer, and thereby the entrance of ions like Na+ from outside is prevented and the surface of the substrate has a low tendency to become of N conductivity type.

According to an embodiment of this invention, the semiconductor device of the invention is provided in the following way.

1. A $SiO_2$ layer is formed partially on a semiconductor surface. Such a $SiO_2$ layer is formed by a method wherein the silicon semiconductor surface is oxidized at a high temperature, a method utilizing $SiO_2$ formed at the time of impurity diffusion, or a method wherein $SiO_2$ is deposited on a semiconductor by thermally decomposing organooxysilane or the like. And then the $SiO_2$ layer is selectively etched by ordinary methods.

2. Then, a $Si_3N_4$ layer is deposited both on said $SiO_2$ layer and on a substrate surface not covered with said $SiO_2$ layer by making use of the reaction of $SiH_4$ gas and $NH_3$ gas at about 700° C.–1000° C., using $N_2$ gas as a carrier gas.

3. A hole for electrode formation is provided at the part of said single $Si_3N_4$ layer different from said double passivation films. Said hole is provided by known photoetching techniques.

4. The semiconductor wafer treated in this way is cut into respective elements to provide a completed semiconductor element.

DESCRIPTION OF THE PREFERRED EMBODIMENTS

Figure 1A:
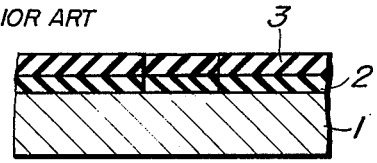
FIGS. 1a and 1b are sectional diagrams showing a semiconductor wafer according to the prior art.
Figure 1B:
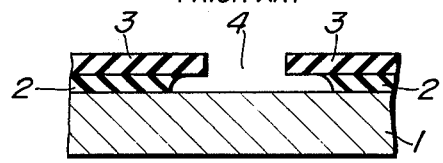

For a better understanding of this invention, a conventional example will be briefly depicted with reference to the accompanying drawings. As shown in FIG. 1a, according to a conventional example, a $SiO_2$ layer 2 is formed on a silicon semiconductor substrate 1 and a $Si_3N_4$ layer 3 is formed on said $SiO_2$ layer 2. Thus, a double passivation film structure is composed so as to provide both of the advantages of said two surface stabilization passivation films. Then, said $Si_3N_4$ and $SiO_2$ films are partially etched away with fluoric acid etchant in order to connect an electrode to the silicon semiconductor substrate and an opening 4 is provided. However, since the chemical properties of said two films differ from each other, the etching speed becomes different and the opening 4 is etched excessively in a transversal direction and scraped inside as shown in the enlarged drawing of FIG. 1b. Accordingly, moisture, etc. is likely to adhere to the gap of the $SiO_2$ and influence the electrical properties seriously. Further, when an electrode is to be derived from the semiconductor surface to the passivation film, the electrode may not be connected at said gap part and, even if connected, the connection may become very weak. In a double passivation film of $SiO_2$ - $Si_3N_4$ according to this invention, said $Si_3N_4$ is much smaller in etching speed than $SiO_2$ and the relation of the etching speed in this system is the reverse of the relation of etching speed in a conventionally known $SiO_2$- glass double passivation film. Thus, etching techniques to be applied to known double passivation films cannot be utilized. Therefore, this invention provides an etching method which is effective when applied to the case where a first film ($SiO_2$) is etched with an etchant which etches a second film ($Si_3N_4$) as described hereinabove and the etching speed of the first film is larger than that of said second film. According to said method, a stabilized semiconductor device is provided.

Figure 2A:
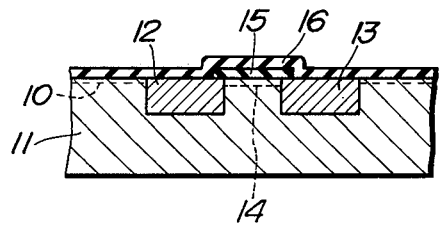
FIGS. 2a to 2c are sectional diagrams showing a semiconductor wafer comprising an MOS type field effect transistor (MOS FET) according to an embodiment of this invention.
Figure 2B:
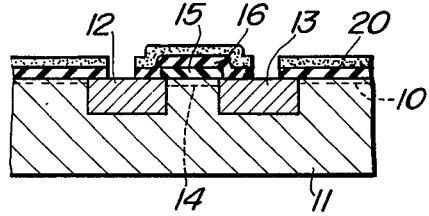
Figure 2C:
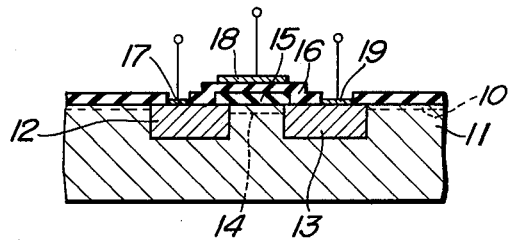

Now, a method of making an MOSFET will be described hereinbelow in conjunction with FIGS. 2a to 2c as an embodiment of this invention.

On a P type silicon semiconductor substrate 11, an N type source region 12 and an N type drain region 13 are formed and a $SiO_2$ film 15 of 1000-2000 A is provided on the substrate between said two regions. Said film 15 induces an N type channel 14 on the substrate surface between said regions. After such a body is prepared, silane and ammonium are made to react at 700°-1000° C., using $N_2$ gas as a carrier gas, to form a $Si_3N_4$ film 16 of 500-1000A in thickness on the surface of said film 15 and said substrate surface. This state is shown in FIG. 2a. Then, as shown in FIG. 2b, the $Si_3N_4$ film provided on a part of the surfaces of the source region 12 and the drain region 13 is exposed to etchant, for example, hydrogen fluoride acid by using a corrosion resistive mask 20 provided by known photo-resisting techniques, e.g. a sensitized KPR film (KPR is a trade mark of Kodak Co., Ltd.). Thereby, a part of the source and drain regions is exposed. After the mask material 20 is eliminated, a source electrode 17, a gate electrode 18 and a drain electrode 19 are set. This state is shown in FIG. 2c. According to a semiconductor passivation film provided in the above method, a $SiO_2$ film 15 is provided on a channel layer which is the most important part for the electrical characteristics of an MOS field effect transistor and all the exposed surfaces of said $SiO_2$ film 15 are covered with a $Si_3N_4$ film 16. Thus, at the part where the passivation film for surface stabilization ($Si_3N_4$ film) is partially etched away and at the part where the semiconductor surface is exposed, moisture or contamination materials are never captured and the electrical characteristics of the element can be made quite stable.

In the MOS FET shown in FIG. 2c, the leakage current between the source and drain regions may flow through the induced channel layer 10 below the single layer of $Si_3N_4$. However the leakage current can be reduced substantially to zero by forming the gate electrode 18 and the channel layer 14 in a ring form surrounding the drain region 13, as known in a ring-gate type MOS FET. It is further to be noted that it is possible in said embodiment to make parts for setting electrodes on the source and drain regions into a single layer only and to form all the other parts into a double layer structure consisting of a $SiO_2$ film and a $Si_3N_4$ film.

Figure 3:
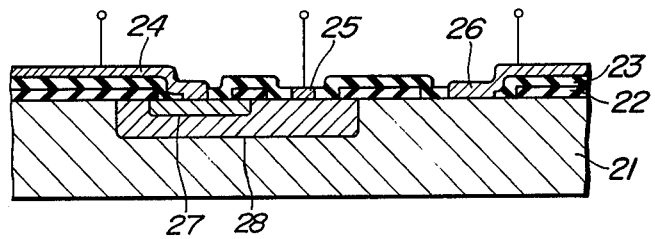
FIG. 3 is a sectional diagram showing a semiconductor substrate comprising a transistor structure according to another embodiment of the invention.

Now, another embodiment of the invention will be described hereinbelow with reference to FIG. 3. This embodiment is provided by applying this invention to the manufacture of a surface stabilized bipolar transistor. A surface passivation film 22 of 3000-5000A consisting of $SiO_2$ is formed to cover and passivate PN junction terminations exposed on the surface of a semiconductor substrate 21 wherein PN junctions 27 and 28 of an emitter and a collector are formed, and on the other surface parts of the semiconductor, a surface passivation film 23 of 3000-4000A consisting of $Si_3N_4$ is provided. Then, parts of said $Si_3N_4$ film 23 necessary for electrode connections are eliminated and electrodes 24, 25 and 26 are connected thereto. In such a transistor, if a $Si_3N_4$ film is adhered directly to the termination of the PN junction, a strong N type channel layer is induced in the semiconductive surface at the vicinity of the PN junction termination by said $Si_3N_4$ film, and thereby the withstand voltage of the PN junction or the current amplification factor is lowered remarkably. However, when this invention is applied as in this embodiment, there should not be such fear and a semiconductor device whose electrical characteristics are quite stable can be obtained. It is needless to mention that said technique is not restricted to transistors, but can be applied to the surface stabilization of diodes, etc. to provide the same effect. Though the stability of the characteristics of the semiconductor element as shown in FIG. 3 is remarkably improved compared with that of the element covered only with a $SiO_2$ layer, a small variation of the characteristics is still observed during the long, high-temperature operation. The investigation of the cause therefor indicates that since $SiO_2$ film is exposed on the side surfaces of the element when said semiconductor wafer is cut or separated by etching into elements, ionic materials like $Na^+$ enter from said parts especially in a high temperature state, move to the adjacent operating parts like the PN junction and change the characteristics of the element. Therefore, in the preferred embodiments to be described hereinbelow, a second film ($Si_3N_4$ in said embodiment) is formed on the first film in a way that the first film ($SiO_2$ in said embodiment) of said double film which contacts the semiconductor substrate may not be exposed outside at all. Now, such an embodiment will be described in conjunction with the accompanying drawings.

Figure 4A:
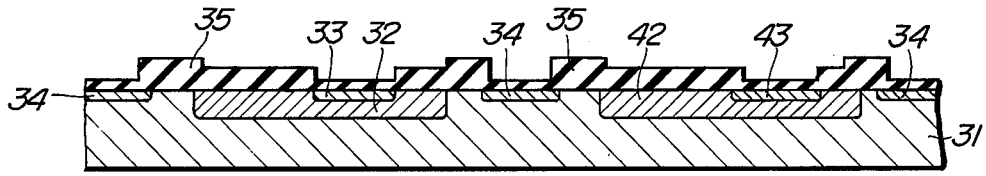
FIGS. 4a to 4d and FIG. 5 are sectional diagrams and a plane diagram of a semiconductor device according to a further embodiment of the invention.

FIG. 4a shows a semiconductor wafer 31 prepared for the application of this invention and N type base layers 32 and 42, P+ type emitter layers 33 and 43 and a P+ type annular layer 34 are formed by applying diffusion technique to a P type semiconductor wafer 31 which becomes a collector. Reference numeral 35 designates a SiO$_2$ layer having a thickness of about 5000A, which can be formed by various methods as described hereinabove, but in this embodiment, it indicates a SiO$_2$ layer provided by oxidizing the semiconductor surface at a high temperature. Such a SiO$_2$ layer includes a phospho-silicate glass layer thermally produced at the time of diffusion treatment.

Figure 4B:
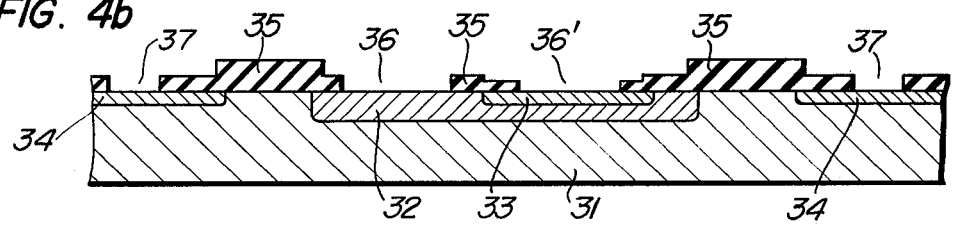

FIG. 4b shows the wafer shown in FIG. 4a in an enlarged way. The same figure shows the state after parts 36 and 36' for placing an electrode in a SiO$_2$ layer 35 and a part 37 for separating the wafer into respective elements are etched away. Said overall treatment was done with a single etching treatment according to a known photoetching method called the photoresist mask etching method.

Figure 4C:
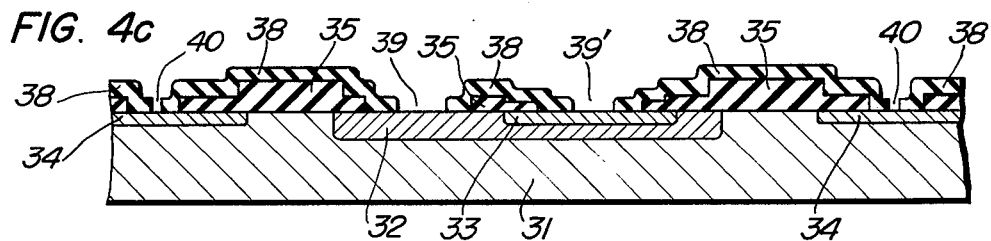

Then, as shown in FIG. 4c, a Si$_3$N$_4$ layer 38, a second layer, having a thickness of about 4000A is formed on said remaining SiO$_2$ layer and on the exposed semiconductor surface by said method and openings 39 and 39' for electrode formation, i.e., exposed semiconductor parts, are formed in that part of the Si$_3$N$_4$ layer which does not comprise said SiO$_2$ layer thereunder by the similar photoetching method. Since said Si$_3$N$_4$ is difficult to etch, a fairly rigid material must be prepared as a mask material. Thus, a method wherein a chromium layer (not shown) is formed on Si$_3$N$_4$ layer 38 in advance, said chromium layer is treated by photoetching technique and then the Si$_3$N$_4$ layer is treated by using effectively the chromium layer as a mask. In this case, it is also possible to etch the other wafer part not comprising the SiO$_2$ layer on the surface thereof, i.e., the Si$_3$N$_4$ layer 38 on the part to be cut as shown by a ditch 40 in FIG. 4c. Then, electrodes 41a and 41b, made e.g. of Al, are formed on the exposed semiconductor surfaces of said wafer.

Figure 5:
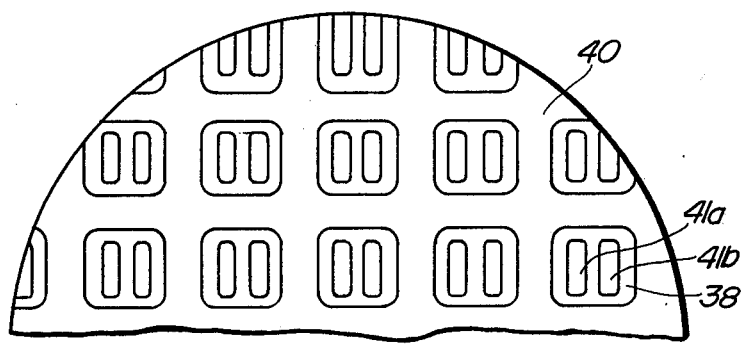

The upper part of the wafer is shown in FIG. 5. Ditches 40 are formed between the respective element parts on said wafer and thus, the apparent representation of the positions for separation is provided.

Figure 4D:
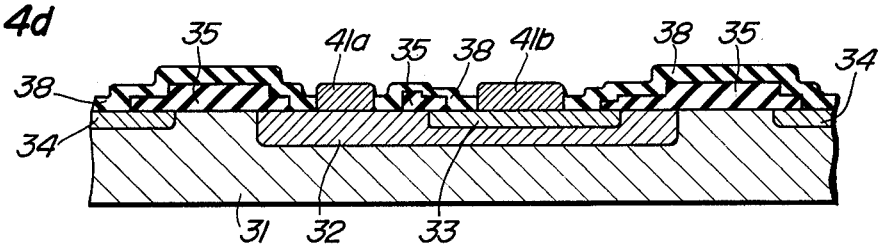

Then, said wafer is cut at said ditch parts by a mechanical or chemical method, etc. to provide respective completed elements as shown in FIG. 4d. In this case, by forming electrode materials in said ditch parts 40 at the time of forming said electrodes 41a and 41b, the defect that Si powder generated in the process of wafer cutting adheres to the wafer surface (generally, it adheres electrostatically) and damages the passivation film can be prevented. Further, if such electrode materials have the property to prevent a channel layer from being induced on said semiconductor surface part (said Al prevents an N type channel), the formation of said annular ring diffused layer can be dispensed with.

Figure 6:
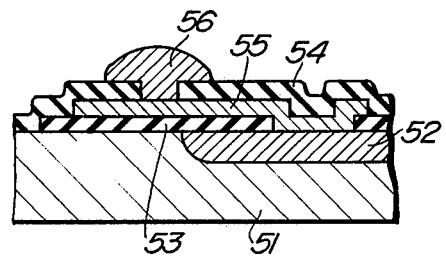
FIG. 6 is a fragmentary sectional diagram of a modified embodiment of the invention.

As is evident from the foregoing description of the invention, when the surface is to be protected with a multiple passivation film according to this invention, the inner passivation film, SiO$_2$ film, is not exposed outside, and a complete surface passivation film is provided. Therefore, it is evident that this invention can be applied to the formation of a double or a multiple passivation film composed of known materials, etc. in addition to the SiO$_2$—Si$_3$N$_4$ double passivation film described hereinabove. It is further possible to derive electrodes, as shown in FIG. 6, by providing an opening to a SiO$_2$ film 53, deriving a first electrode 55 from the surface of a semiconductive region 52 within a semiconductor substrate 51 onto the SiO$_2$ film 53 through said opening, forming a Si$_3$N$_4$ film 54 in a way to cover said SiO$_2$ film 53 and the first electrode 55, providing an opening to the Si$_3$N$_4$ film 54 in a way to expose the first electrode 55 on the SiO$_2$ film 53 and connecting a second electrode 56 to the first electrode 55 through said opening. Also in this case, the SiO$_2$ film 53 is perfectly covered with the Si$_3$N$_4$ film 54 and therefore, no fear that Na+ ions enter into said SiO$_2$ film from external presents.

We claim:

1. A field-effect semiconductor device comprising:
   a semiconductor substrate having a major surface;
   at least a pair of spaced semiconductor regions formed in said major surface of said substrate, having a conductivity type opposite to that of the adjacent semiconductor material and defining PN junctions terminating at the major surface with the adjacent semiconductor material;
   an oxide film covering at least the portion of said major surface between said pair of said semiconductor regions;
   an insulating film of silicon nitride which directly covers the entire exposed surface of said oxide film and the exposed surface of said major surface of the substrate to completely shield said oxide film from the surrounding atmosphere, said silicon nitride film being of substantially uniform thickness over its entire length and having further holes exposing surface portions of said semiconductor regions;
   a gate electrode formed on at least a part of said insulating film covering said oxide film; and
   a source and a drain electrode respectively formed on said exposed surface portions of said semiconductor regions in spaced relationship to said oxide film through said silicon nitride film.

2. A semiconductor device comprising a first conductivity type semiconductor substrate having a principal surface;
   a second conductivity type region formed in said principal surface, the entire edge portion of a PN junction formed between said first conductivity type semiconductor substrate and said second conductivity type region terminating at said principal surface;
   a first conductivity type region formed in the surface of said second conductivity type region, the entire edge portion of another PN junction formed between said second conductivity type region and said first conductivity type region terminating at said principal surface;
   a first insulating film consisting mainly of silicon oxide covering at least the exposed entire edge portions of said respective PN junctions and the vicinity thereof but not the surroundings of said principal surface, said first insulating film having holes extending to said first and second conductivity type regions;
   a second insulating film of silicon nitride which directly covers the entire exposed surface of said first film and the exposed surface of said principal surface of the substrate to completely shield said first insulating film from the surrounding atmosphere, said silicon nitride film being of substantially uniform thickness over its entire length and having further holes exposing surface portions of said first and second conductivity type regions; and first and second conducting means respectively formed on said exposed surface portions of said first and second regions in spaced relationship to said first insulating film through said silicon nitride film.

3. A semiconductor device according to claim 2, further comprising a first conductivity type heavily doped annular ring region formed in said principal surface of said first conductivity type semiconductor substrate so as to surround said second conductivity type region, wherein at least a part of the surface of said annular ring region is covered with said first film and said second film covering said first film.

4. A semiconductor device according to claim 2, wherein said first conductivity type is P type, said second conductivity type is N type and said substrate is made of silicon.

* * * * *